(12) United States Patent
Hu et al.

(10) Patent No.: US 7,749,849 B2
(45) Date of Patent: Jul. 6, 2010

(54) METHODS OF SELECTIVELY OXIDIZING SEMICONDUCTOR STRUCTURES, AND STRUCTURES RESULTING THEREFROM

(75) Inventors: Yongjun Jeff Hu, Boise, ID (US); Allen McTeer, Eagle, ID (US); Naga Chandrasekaran, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/958,972

(22) Filed: Dec. 18, 2007

(65) Prior Publication Data

US 2009/0152629 A1    Jun. 18, 2009

(51) Int. Cl.
*H01L 21/336* (2006.01)
(52) U.S. Cl. .................... 438/292; 438/300; 438/308; 257/288; 257/401
(58) Field of Classification Search .............. 438/292, 438/300, 308; 257/288, 401
See application file for complete search history.

(56) References Cited

U.S. PATENT DOCUMENTS

| | | | |
|---|---|---|---|
| 5,907,780 A | 5/1999 | Gilmer et al. | |
| 5,998,290 A | 12/1999 | Wu et al. | |
| 6,319,806 B1 * | 11/2001 | Kim | 438/592 |
| 6,498,107 B1 | 12/2002 | Fenner | |
| 6,756,268 B2 | 6/2004 | Rudeck et al. | |
| 6,797,334 B2 | 9/2004 | Akizuki et al. | |
| 6,797,339 B2 | 9/2004 | Akizuki et al. | |
| 6,800,565 B2 | 10/2004 | Hu et al. | |
| 2001/0025971 A1 | 10/2001 | Powell | |
| 2002/0130376 A1 | 9/2002 | Wang et al. | |
| 2003/0143340 A1 | 7/2003 | Akizuki et al. | |
| 2006/0124934 A1 * | 6/2006 | Fukumiya et al. | 257/66 |
| 2009/0087579 A1 * | 4/2009 | Hautala | 427/527 |

* cited by examiner

*Primary Examiner*—Phuc T Dang
(74) *Attorney, Agent, or Firm*—TraskBritt

(57) ABSTRACT

Methods for selectively oxidizing a semiconductor structure include generating a gas cluster ion beam comprising an oxidizing source gas, directing the gas cluster ion beam to a region of a substrate adjacent a conductive line and exposing the region to the gas cluster ion beam including an oxidizing matter. Utilizing the gas cluster ion beam enables selective oxidation of a targeted region at temperatures substantially lower than those of typical oxidation processes thus, reducing or eliminating oxidation of the conductive line. Semiconductor devices including transistors formed using such methods are also disclosed.

28 Claims, 7 Drawing Sheets

METHODS OF SELECTIVELY OXIDIZING SEMICONDUCTOR STRUCTURES, AND STRUCTURES RESULTING THEREFROM

FIELD OF THE INVENTION

Embodiments of the present invention relate to methods of selectively oxidizing structures, such as semiconductor structures. Embodiments of the present invention also relate to structures that include selectively oxidized portions.

BACKGROUND

Semiconductor devices include one or more integrated circuits that can be used to store data, process electronic signals, etc. Such semiconductor devices are used in virtually all modern electronic devices. There are several different types of semiconductor devices used in modern electronics including, for example, memory devices, electronic signal processors, devices for capturing or acquiring images, etc. Each of these semiconductor devices typically comprises a plurality of transistors, which can be used as gates or switches for electrical signals. A metal-oxide-semiconductor field-effect transistor (MOSFET) is a common type of transistor useful in high speed switching applications and integrated circuits. A typical MOSFET includes a metal-insulator structure, often referred to as a "gate," between lightly doped drain (LDD) extension regions in a semiconductor substrate.

FIG. 1 is a schematic cross-sectional view of a transistor 10 that may be used in a memory cell of a non-volatile memory device. The transistor 10 may be fabricated on or in a substrate 12, which may comprise a doped semiconductor material. The transistor 10 includes a gate stack 22 formed between LDD extension regions 24 in the substrate 12. The LDD extension regions 24 may comprise, for example, doped regions in or on the substrate 12, which itself may be doped of opposite polarity relative to the LDD extension regions 24. For example, the LDD extension regions 24 may comprise n-doped regions in or on the substrate 12, and the substrate 12 may be p-doped, at least in the region thereof between the LDD extension regions 24, so as to provide an np-type structure in the substrate 12 below the gate stack 22. The gate stack 22 is electrically isolated from the substrate 12 by the gate oxide 14. The gate stack 22 is typically formed by conventional methods and includes a conductive polysilicon material 16. As polysilicon resistivity is considerably higher than that of tungsten (W) or other metals, a tungsten layer 18 is typically employed over the polysilicon material 16 in order to decrease resistance while retaining the gate integrity.

The gate stack 22 is conventionally formed using masking and etching processes to respectively remove portions of a nitride material 20, the tungsten layer 18, and the polysilicon material 16 through an aperture in a mask (not shown). This process exposes a cross section of the device layers on the sidewalls 27 of the gate stack 22. Typically, during the etching process the gate oxide 14 is employed as an etch stop. Etching tends to cause considerable damage to a surface 26 of the gate oxide 14 adjacent the gate stack 22, as shown in FIG. 1. Such damage occurs regardless of efforts to optimize etch selectivity and optical end point measurement techniques. The etch damage may also extend to the underlying substrate 12.

Damage to the gate oxide 14 caused by plasma etching may cause susceptibility to hot carrier effects and may cause defects such as charge trapping, and current leakage. Aside from the illustrated physical thinning, plasma etching tends to damage oxide bonds, creating charge trap sites. Structural damage often extends laterally under the gate as well as over adjacent LDD extension regions 24. Such defects result in an increased threshold voltage and unreliable circuit operation. As a high quality gate insulator is required for reliable operation of the transistor 10 and of the circuit employing the transistor 10, this damage must be repaired to improve the quality and life expectancy of the gate oxide 14.

Selective oxidation of the gate oxide, often referred to as "source/drain reoxidation," is employed to repair portions of the surface damaged during the gate formation. Source/drain reoxidation typically involves thermal oxidation of the semiconductor substrate to grow new oxide material. During thermal oxidation, the semiconductor substrate is exposed to oxygen gas or water at high temperatures (e.g., 700° C.-1200° C.) for a relatively long period of time. The high temperature oxidizing gas reacts with the semiconductor substrate to produce an oxide material.

While the reaction of the oxidizing gas with the substrate during thermal oxidation repairs the damaged gate oxide, the oxidizing gas may also contact and potentially react with any exposed gate materials. Thermal oxidation is problematic because some metals, such as tungsten (W), are so readily oxidized that overall gate resistance is increased beyond tolerable levels. For example, tungsten begins to oxidize to tungsten trioxide ($WO_3$) at temperatures of approximately 250° C. Thus, in the presence of high temperatures necessary for thermal oxidation, oxygen gas may also undesirably react with a conductive line, compromising integrity of the conductive line and increasing resistance of the device. As shown in FIG. 2, one method of preventing degradation of the gate stack 22 during source/drain reoxidation is to form a protective barrier covering the sidewalls 27 of the gate stack 22. For example, U.S. Pat. No. 5,998,290 to Wu et al. describes the use of a partial nitride spacer etch used to for nitride spacers 29 that preserves the integrity of the sidewalls 27. After the nitride material 20, the tungsten layer 18 and a portion of the polysilicon material 16 are patterned by plasma etching, a nitride layer (not shown) is deposited over the sidewalls 27 of the gate stack 22 and exposed regions of the polysilicon material 16. The nitride spacers 29 act as a protective barrier preventing degradation of conductive material 18 during source/drain reoxidation.

However, as minimum feature size and critical dimensions continue to decrease, nitride spacers cannot be scaled accordingly. The nitride spacers trap electrons, causing an increase in parasitic resistance. Deposition process limitations prevent the formation of defect-free nitride spacers with thicknesses less than about eighty nanometers (80 nm). Accordingly, the charge-trapping nitride spacers prevent the critical dimension of the polysilicon material of the conductive line from being decreased. For example, in a transistor with a thirty-five nanometer (35 nm) conductive line, the nitride spacers and, thus, the polysilicon material, are at least 120 Å (e.g., about half the critical dimension). The inability to reduce the area of the charge-trapping nitride spacers, in combination with a decrease in the cross-sectional area of the gate, leads to an undesirable increase in gate resistance. Furthermore, current methods limit the size of the device by preventing a decrease in the critical dimensions of polysilicon material. Thus, while the nitride spacers may prevent oxidation of the gate stack, they also limit the feature size of the resulting device.

For the reasons stated above, and for other reasons which will become apparent to those skilled in the art upon reading and understanding the present specification, there is a need in the art for improved methods of gate fabrication and associated structures that can be scaled to smaller feature sizes without causing an undesirable increase in gate resistance.

DETAILED DESCRIPTION

Broadly, embodiments of the present invention include methods for selectively oxidizing substrates, and the resulting structures. Although the embodiments described herein are illustrated in the context of MOSFET transistors, it will be understood and appreciated by those of ordinary skill in the art that the methods described herein will also have application in oxidizing substrates while protecting conductive materials susceptible to oxidation or corrosion in other contexts.

FIGS. 3-8 are cross-sectional views of a portion of an embodiment of a method of fabricating a semiconductor device 30 of the present invention, and illustrate a transistor gate stack.

Figure 1:
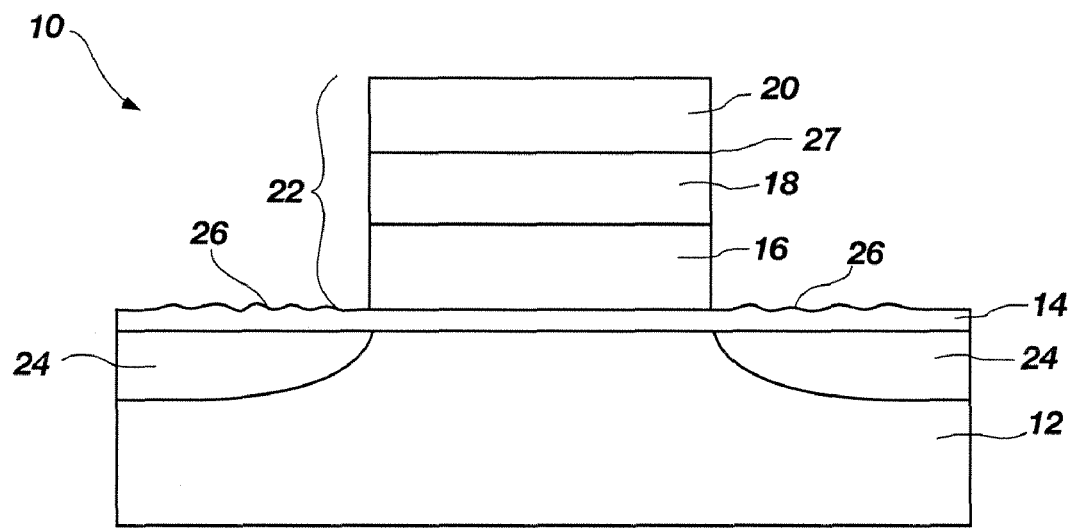
FIGS. 1 and 2 are partial cross-sectional views of a semiconductor device illustrating a transistor known in the art.
Figure 2:
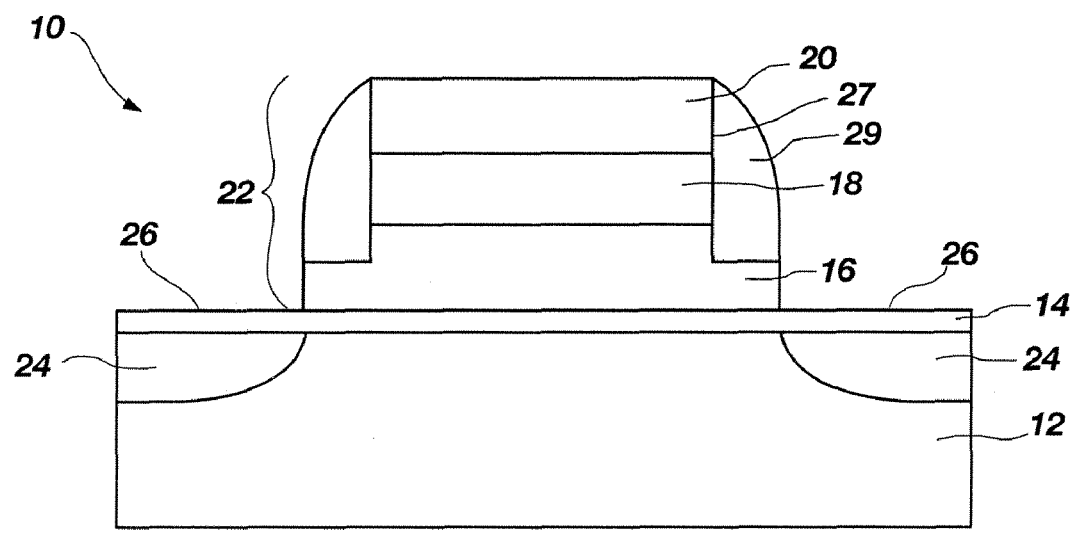
Figure 3:
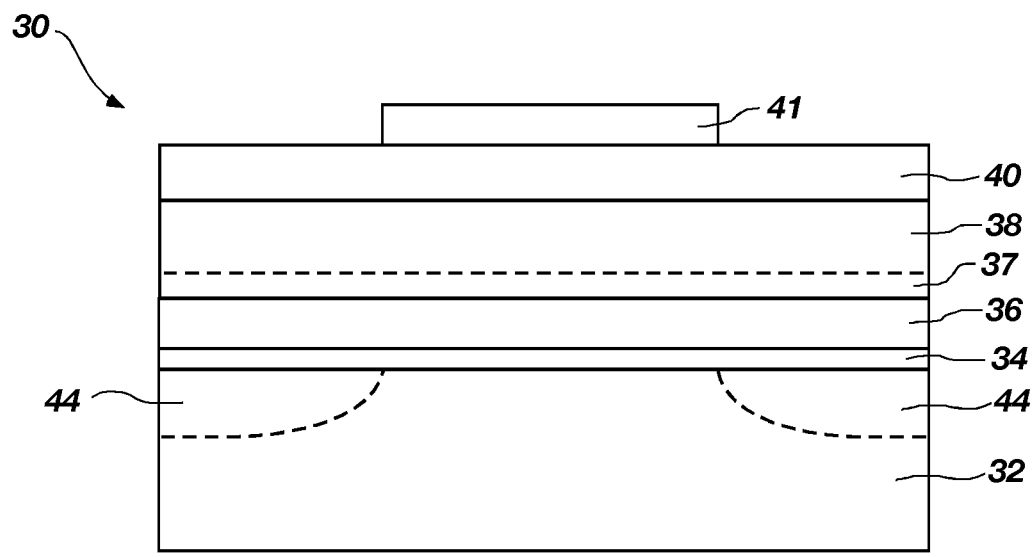
FIGS. 3-5 are partial cross-sectional views illustrating an embodiment of a method of the present invention that may be used to selectively oxidize regions of a substrate, such as the source and drain regions, in forming semiconductor devices.

FIG. 3 depicts an example of semiconductor device 30 including an oxide material 34, polysilicon 36, a conductive material 38, and a dielectric material 40 formed over a substrate 32. The substrate 32 may be formed from a variety of materials including, but not limited to, silicon, polysilicon, germanium, gallium arsenide, indium phosphide, silicon-on-insulator (SOI) type substrates, silicon-on-sapphire (SOS) type substrates, and epitaxial layers of silicon supported by a layer of base material. Optionally, the substrate 32 may be doped to form LDD extension regions 44, as shown by phantom lines. By way of example and not limitation, the LDD extension regions 44 may comprise n-doped regions in or on the substrate 32, and the substrate 32 may be p-doped at least in the region thereof between the LDD extension regions 44. The oxide material 34 may be formed on the substrate 32, for example, by atomic layer deposition (ALD) methods, plasma-enhanced chemical vapor deposition (PECVD) methods, wet or dry oxidation, or any other suitable methods. The conductive material 38 may be formed from a metal, such as, for example, tungsten (W), aluminum (Al), tantalum (Ta), titanium (Ti), or a silicide or alloy thereof. As a non-limiting example, the conductive material 38 may be formed over the polysilicon 36 using chemical vapor deposition (CVD) methods, physical vapor deposition (PVD) methods, spin-on methods, sputtering, or other suitable methods. The dielectric material 40 may include, for example, silicon nitride ($Si_3N_4$) or any other suitable dielectric material known in the art. Optionally, a barrier material 37, such as titanium nitride (TiN) or any other material suitable for use as a barrier material, may be formed over polysilicon 36, as shown by phantom lines in FIG. 3. A mask material 41 may be applied over the dielectric material 40 and patterned using a conventional photolithography process to expose regions of the dielectric material 40 in locations where removal of material is desired.

Figure 4:
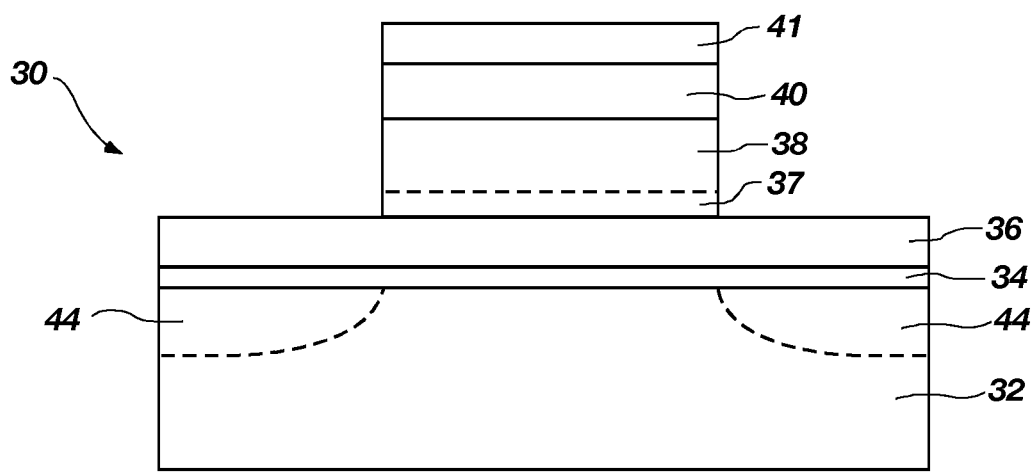

Referring to FIG. 4, regions of the dielectric material 40 and the conductive material 38 (and, optionally, the barrier material 37) exposed through the mask material 41 may be removed by methods known in the art. As a non-limiting example, a dry reactive ion etching (RIE) process may be used to etch through the dielectric material 40 and the conductive material 38, (and, optionally, through the barrier material 37).

Figure 5:
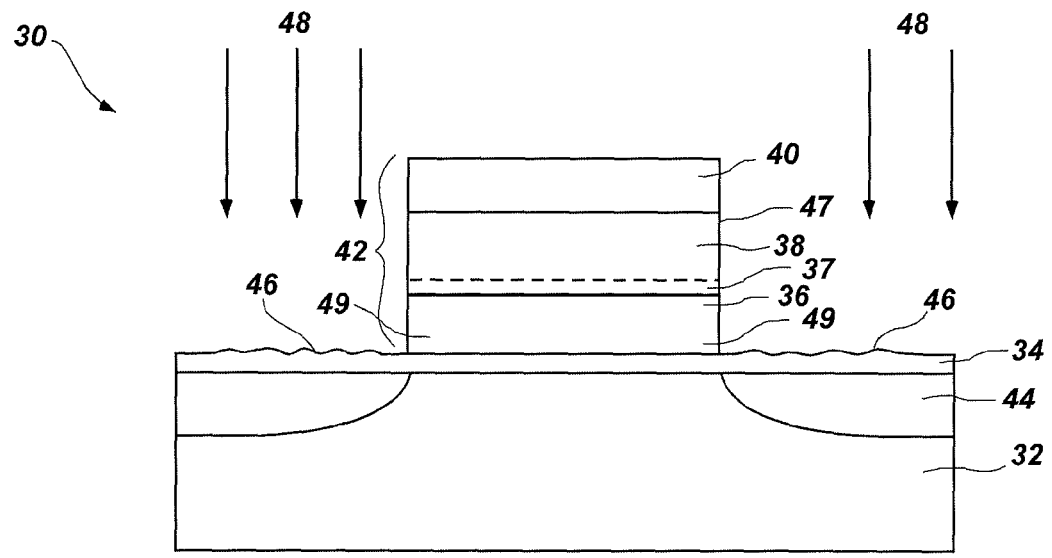

Referring to FIG. 5, the polysilicon 36 exposed through the mask material 41 may be removed to form a gate stack 42 that includes the polysilicon 36, the conductive material 38 and the dielectric material 40 (and, optionally, the barrier material 37). The resulting semiconductor device 30 includes a gate stack 42 with exposed vertical sidewalls 47, protruding from the substrate 32. As used herein, the term "vertical" means and includes a direction perpendicular to the plane parallel to the surface of a substrate 32, regardless of the orientation of the substrate 32. As a non-limiting example, the polysilicon 36 may be selectively etched with respect to the underlying oxide material 34 using a gas plasma with a mixture of hydrogen bromide (HBr) and chloride (Cl) or gas plasma with carbon tetrafluoride ($CFl_4$). In additional embodiments, the polysilicon 36 may be removed using a dry reactive ion etching process. In some embodiments, the oxide material 34 may be used as an etch stop material during the removal of the polysilicon 36. Regardless of the selectivity of the particular etch used to remove the polysilicon 36, a surface 46 of the oxide material 34 adjacent to the gate stack 42 may be damaged or degraded during the etching process. Additionally, portions of the substrate 32 may be exposed through the surface 46 as a result of excessive degradation of the oxide material 34 during the patterning of the gate stack 42.

As is known in the art, a high quality oxide gate insulator is significant to the performance of semiconductor devices. Damage to the surface 46 of the oxide material 34 may lead to a variety of undesirable effects such as hot carrier effects, charge trapping and current leakage. Such effects may increase the threshold voltage of the gate while rendering circuit function unreliable. Thus, it is desirable to oxidize the surface 46 to repair the oxide material 34 and improve quality and prolong life of the gate stack 42.

As shown in FIG. 5, a gas cluster ion beam (GCIB) 48 may be employed in selectively oxidizing the surface 46 damaged during gate stack 42 formation without oxidizing the conductive material 38. Additionally, the GCIB 48 may be employed in oxidizing a lower region 49 of the polysilicon 36 abutting the surface 46 of the semiconductor device 30. The GCIB 48 may comprise oxidizing matter formed from, for example, pure oxygen ($O_2$) or any other condensable gas containing oxygen, such as nitric oxide (NO), carbon monoxide (CO), carbon dioxide ($CO_2$) water ($H_2O$) or hydrogen peroxide ($H_2O_2$). Additionally, the GCIB 48 may comprise an oxidizing matter in combination with an inert gas, such as nitrogen ($N_2$), helium (He), argon (Ar), krypton (Kr) or neon (Ne). The GCIB 48 may be generated to provide atoms within an accelerated gas cluster at energies approximately equal to or greater than the bond energy of the substrate 32. By way of example and not limitation, the size of the gas cluster may be in a range extending from about one hundred (100) atoms per cluster to greater than about five thousand (5,000) atoms per cluster. As a non-limiting example, the GCIB 48 may be formed from pure oxygen ($O_2$) cluster ions each having greater than about five thousand (5,000) atoms per charge. In contrast to thermal oxidation, the GCIB 48 may be directed to target specific regions of the surface 46 and may be performed at temperatures at or about room temperature (e.g., about 18° C. to about 23° C), thus eliminating or substantially decreasing oxidation of the conductive material 38.

Figure 6:
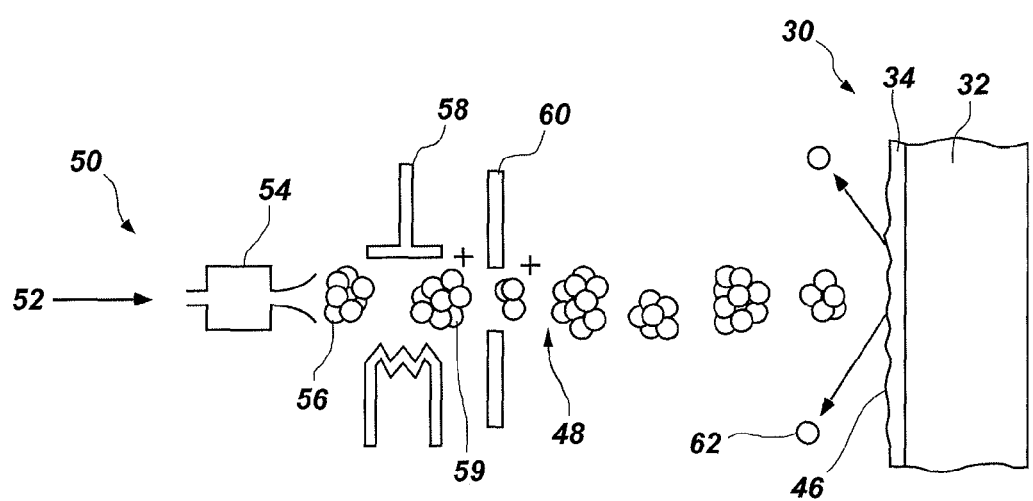
FIG. 6 is a schematic illustration depicting a typical apparatus for forming a gas cluster ion beam (GCIB) that may be used in an embodiment of the present invention to selectively oxidize a semiconductor device, such as that shown in FIG. 5.

FIG. 6 illustrates a portion of the surface 46 of the semiconductor device 30 undergoing bombardment by charged gas clusters 59 formed by employing a conventional GCIB apparatus 50. A suitable GCIB apparatus 50 may be obtained commercially from Epion Corporation (Billerica, Mass.). The GCIB apparatus 50 comprises a high-pressure gas source 52, a nozzle 54 (e.g., a Venturi nozzle), an ionizer 58, and an accelerator 60. The formation of a gas cluster 56 is achieved through supersonic gas expansion from the high-pressure gas source 52 into a vacuum (not shown) through the nozzle 54. The nozzle 54 determines the gas cluster 56 size and the flow pattern of the GCIB 48. The gas cluster 56, which is held together by van der Waals forces, is ionized by electrons produced by the ionizer 58 resulting in a charged gas cluster 59 comprised of a cluster of atoms with a single, shared positive charge. The charged gas cluster 59 is passed to an accelerator 60 that uses a series of electrodes to accelerate the charged gas cluster 59 to an energy approximately equal to or greater than the individual bond energy of the atoms making up the substrate 32. For example, the charged gas cluster 59 may be accelerated to an energy in a range extending from about one kiloelectron volt (1 keV) to about sixty kiloelectron volts (60 keV). The GCIB 48 may be controlled to deliver a dosage in the range extending from about $1 \times 10^{13}$ ions/cm$^2$ to about $5 \times 10^{15}$ ions/cm$^2$. The charged gas cluster 59 may be focused, for example, by electrostatic lenses (not shown) such that the GCIB 48 may be oriented in a direction perpendicular to the surface 46 of the oxide material 34 overlying the substrate 32. As the charged gas cluster 59 beam line is directed at the surface 46, the semiconductor device 30 may be mechanically scanned to cover areas of the surface 46 where oxidation may be desired.

Figure 7:
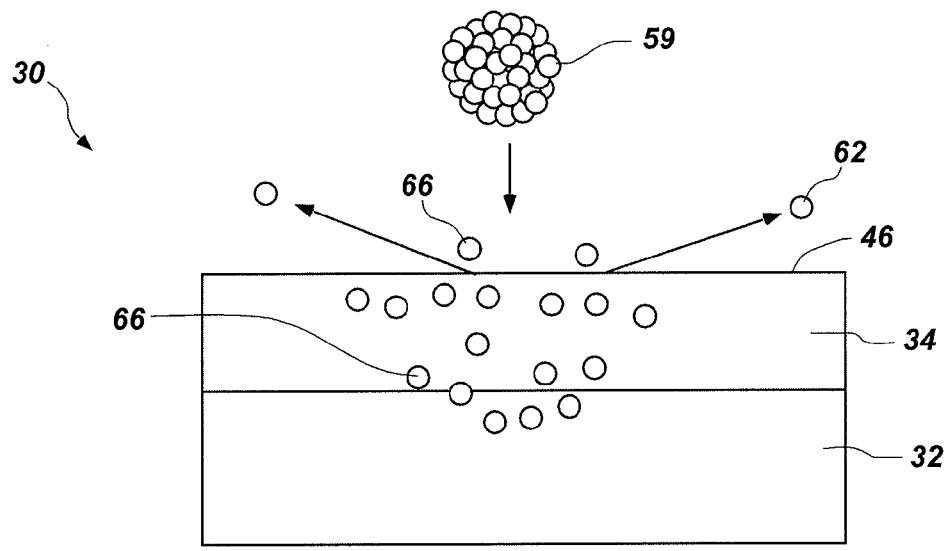
FIG. 7 is an enlarged schematic view illustrating principles of oxidation using a GCIB.

FIG. 7 is an enlarged view of the charged gas cluster 59 impacting the surface 46 of the semiconductor device 30, as shown in FIG. 6. Without wishing to be bound by any particular theory, it is believed that, upon impact with the surface 46, kinetic energy causes the charged gas cluster 59 to break apart into atoms 66 that collide with and diffuse into the substrate 32. As the charged gas cluster 59 disperses into individual atoms 66, the energy of acceleration of the charged gas cluster 59 is divided among the atoms 66. For example, a charged gas cluster 59 comprising one hundred (100) atoms accelerated through ten kiloelectron volts (10 keV) results in an average energy of ten electron volts (10 eV) per atom as the cluster impacts the surface. The high energy of the atoms may overcome the activation energy barrier of the substrate 32 enabling the atoms 66 to break bonds within and react with the substrate 32 at a relatively high rate to produce oxide material 34. Thus, by employing a GCIB, the energy barrier may be overcome without the need for high temperatures typically needed to perform oxidation. Depending on the size and acceleration energy of the charged gas cluster ions 59, scattered atoms 62 may be deflected from the surface 46. The scattered atoms 62 may collide and react with and oxidize the lower region 49 of the polysilicon 36, as shown by phantom lines.

Figure 8:
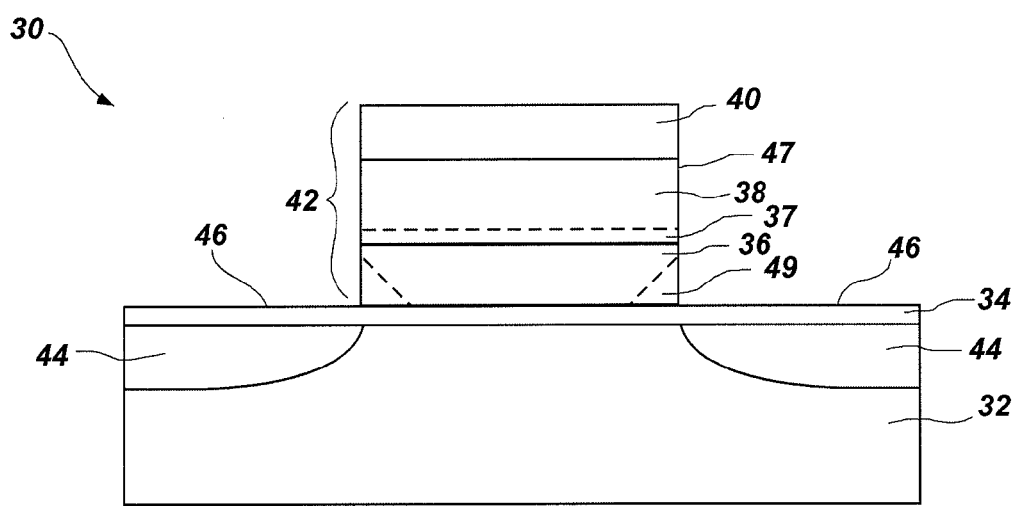
FIG. 8 is a partial cross-sectional view illustrating an embodiment of a semiconductor device of the present invention having an oxide material formed on a surface thereof.

FIG. 8 depicts the semiconductor device 30 after the surface 46 has been oxidized by employing an oxidizing GCIB 48. Exposure to the oxidizing GCIB 48 may repair regions of the surface 46 damaged as a result of etching processes used to pattern the gate stack 42 and ion implantation processes used to form LDD extension regions 44 in the substrate 32. The reaction of the high energy, oxygen-containing gas clusters emitted by GCIB 48 with the substrate 32 enables diffusion of the oxygen into the substrate 32 and promotes formation of oxide material 34. As a non-limiting example, the oxide material 34 formed using the GCIB 48 may have thickness in a range of from about thirty angstroms (30 Å) to about 140 angstroms (140 Å) and an average roughness ($R_a$) of less than about six angstroms (6 Å). The reaction between the GCIB 48 and the substrate 32 is self-limiting. Thus, a GCBI with an higher energy (ions/cm$^2$) may be used to form silicon dioxide with an increased thickness whereas a GCIB with an lower energy (ions/cm$^2$) enables the formation of silicon dioxide with a decreased thickness.

The high energy atoms produced by the GCIB 48 enable repair the of the oxide material 34 on the surface 46 of the oxide material 34 overlying the substrate 32 by inducing oxide formation in the absence of thermal energy. By performing oxidation utilizing the GCIB 48 at temperatures below about 250° C., the conductive material 38 is less susceptible to oxidizing effects such as those associated with conventional thermal oxidation processes. As such, the GCIB 48 may be employed to oxidize the surface 46 while the conductive material 38 remains substantially oxide-free.

In conventional thermal oxidation processes known in the art, the semiconductor device 30 is exposed to oxygen gas at high temperatures, which may damage or degrade exposed regions of the conductive material 38. Without the use of a physical barrier, such as nitride spacers 29 it is difficult to prevent the oxygen gas from contacting and oxidizing the conductive material 38 of the gate stack 42. By employing a GCIB 48 in a selective oxidation act, the oxidizing matter may be focused on damaged regions of the surface 46 in a direction parallel to the vertical sidewalls 47, thus substantially eliminating or reducing the oxidation of conductive material 38. Formation of a transistor without nitride spacers decreases process steps and enables the fabrication of a smaller gate stack 42 without substantially increasing resistance in the conductive line.

Figure 9:
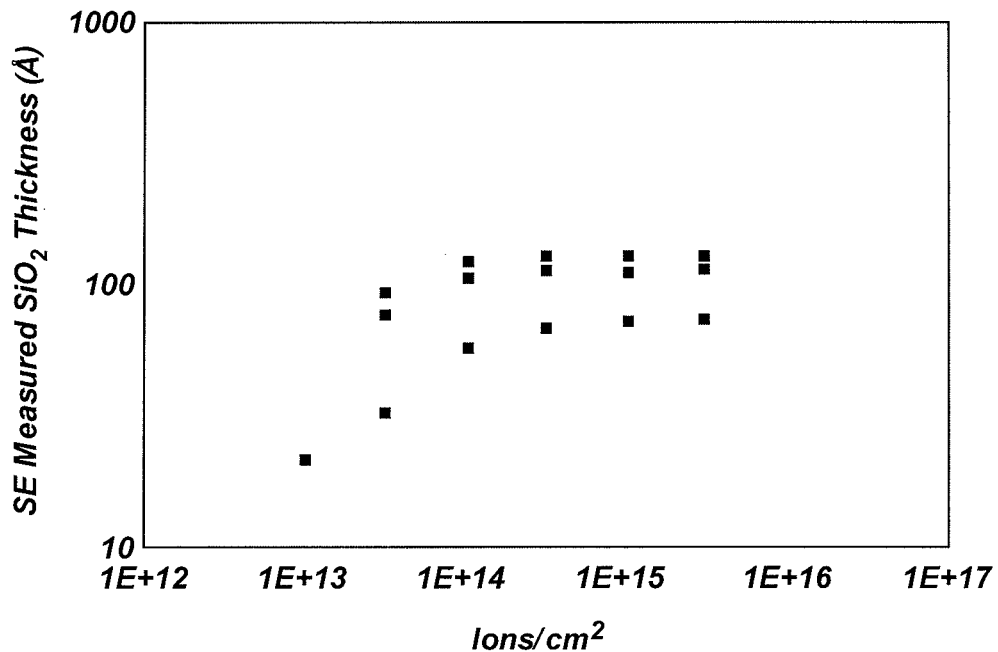
FIG. 9 graphically illustrates the relationship between the dose rate of an oxygen ($O_2$) GCIB and the thickness of a layer of silicon dioxide ($SiO_2$) formed using an embodiment of a method of the present invention.

FIG. 9 is a plot showing the thickness of silicon dioxide ($SiO_2$) formed at room temperature by exposing a silicon substrate to oxygen GCIBs at various doses (ions/cm$^2$) at increasing acceleration energies. These results demonstrate that increasing the dose (ions/cm$^2$) of the oxygen GCIB results in the formation of silicon dioxide ($SiO_2$) with increasing thicknesses. Thus, the thickness of the silicon dioxide ($SiO_2$) may be controlled by altering the oxygen GCIB dose (ions/cm$^2$). For example, silicon dioxide ($SiO_2$) with a thickness in a range of from about thirty angstroms (30 Å) to about 140 angstroms (140 Å) may be formed by irradiating silicon with an oxygen GCIB at a dose in a range of from about $1 \times 10^{13}$ ions/cm$^2$ to about $5 \times 10^5$ ions/cm$^2$.

Figure 10:
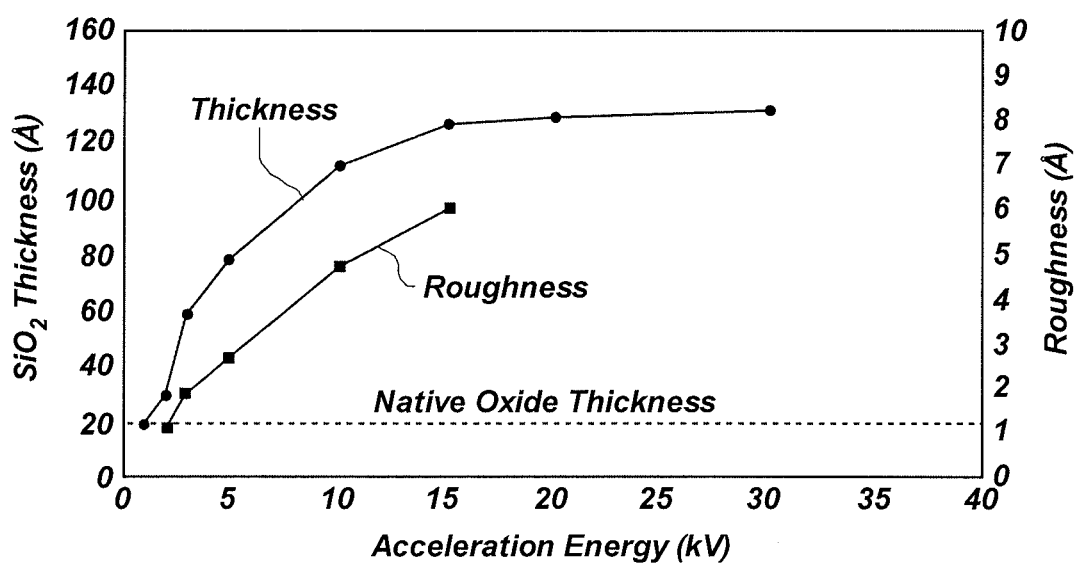
FIG. 10 graphically illustrates the relationship between the acceleration energy of an oxygen ($O_2$) GCIB and both the thickness of silicon dioxide and the roughness of a layer of silicon dioxide formed using an embodiment of a method of the present invention.

FIG. 10 is a plot demonstrating the ability to control the thickness and roughness of silicon dioxide ($SiO_2$) formed on a silicon substrate by adjusting the acceleration energy (keV) of the dose received. Increasing the acceleration energy (keV)

of the oxygen GCIB enables the formation of silicon dioxide ($SiO_2$) with increasing thicknesses. However, at higher acceleration energies (keV) the roughness of the silicon dioxide ($SiO_2$) may increase. Depending on the thickness of the silicon dioxide ($SiO_2$) material desired, the acceleration energy may be optimized to prevent roughness.

Figure 11A:
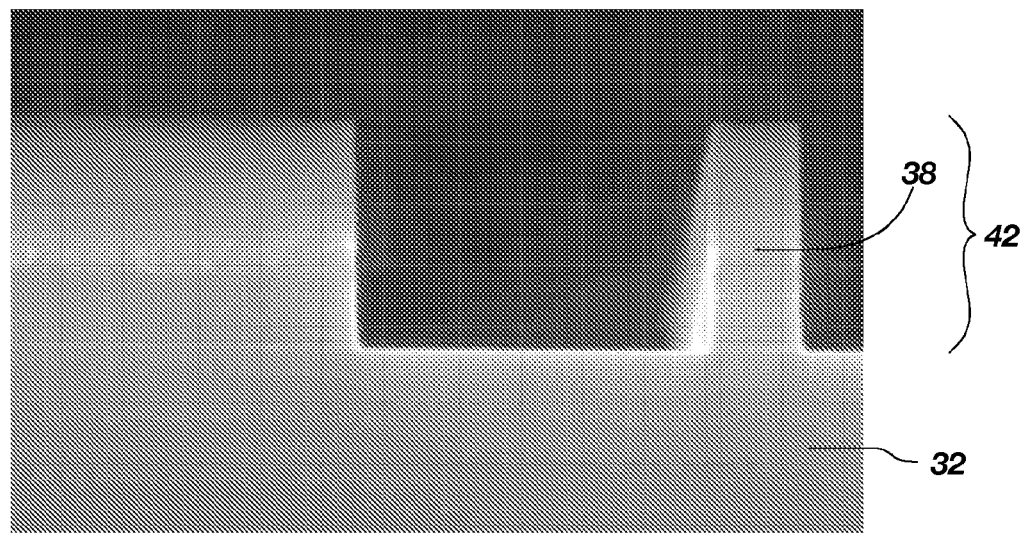
FIGS. 11A-11C are scanning electron micrographs of cross-sections of gate stacks formed by an embodiment of a method of the present invention.
Figure 11B:
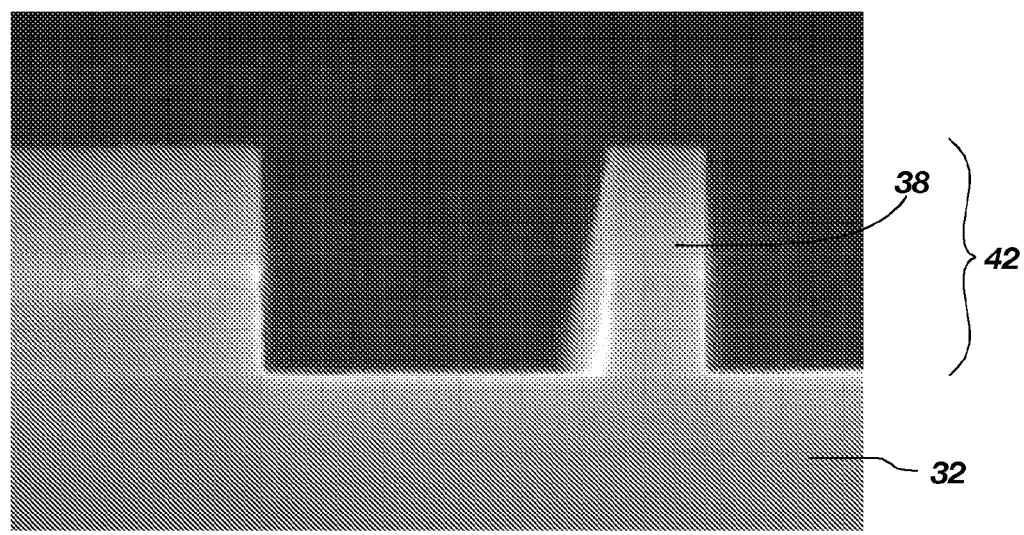
Figure 11C:
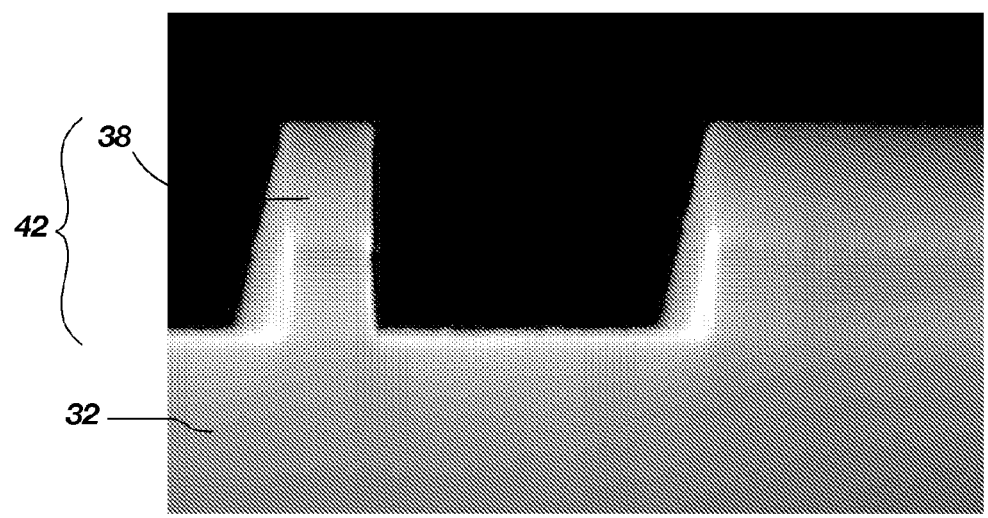

FIGS. 11A-11C are scanning electron micrographs of a cross-section of different gate stacks. FIG. 11A shows a gate stack 42 patterned on a silicon substrate 32 prior to oxidation by an oxygen GCIB. The gate stack 42 shown in FIG. 11B has been exposed to an oxygen GCIB at an energy of two kiloelectron Volts (2 keV) to form silicon dioxide ($SiO_2$) with a thickness of fifty angstroms (50 Å). FIG. 11C shows a gate stack 42 after exposure to an oxygen GCIB with an energy often kiloelectron Volts (10 keV) to form silicon dioxide ($SiO_2$) with a thickness of one-hundred-forty angstroms (140 Å). The conductive material 38 of the gate stacks 42 treated with the oxygen GCIB shown in FIGS. 11B and 11C is substantially identical to the conductive material 38 of the gate stack 42 untreated by the oxygen GCIB shown in FIG. 11A and, thus, does not appear to be substantially oxidized.

While the invention may be susceptible to various modifications and alternative forms, specific embodiments have been shown by way of non-limiting example in the drawings and have been described in detail herein. However, it should be understood that the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method for selectively oxidizing a semiconductor structure, comprising:
   generating a gas cluster ion beam comprising an oxidizing matter; and
   directing the gas cluster ion beam toward a degraded region of a surface of the semiconductor structure adjacent at least one conductive element formed on the surface of the semiconductor structure to oxidize and repair the degraded region.

2. The method of claim 1, wherein generating a gas cluster ion beam comprising an oxidizing matter comprises generating a gas cluster ion beam from a source gas selected from the group comprising oxygen, nitric oxide, carbon monoxide, carbon dioxide, water, and hydrogen peroxide.

3. The method of claim 1, wherein generating a gas cluster ion beam comprising an oxidizing matter comprises generating a gas cluster ion beam from a source gas comprising a mixture of an oxygen-containing gas and an inert gas.

4. The method of claim 1, wherein generating a gas cluster ion beam comprising an oxidizing matter comprises generating an oxygen gas cluster ion beam.

5. The method of claim 1, wherein directing the gas cluster ion beam toward a degraded region of a surface of the semiconductor structure comprises causing the gas ion cluster beam to selectively impinge on the degraded region of the surface without contacting the at least one conductive element.

6. The method of claim 1, wherein directing the gas cluster ion beam toward a degraded region of a surface of the semiconductor structure comprises orienting the gas cluster ion beam in a direction substantially perpendicular to the surface of the semiconductor structure.

7. The method of claim 1, wherein directing the gas cluster ion beam toward a degraded region of a surface of the semiconductor structure comprises directing the gas cluster ion beam toward at least one LDD extension region of a transistor.

8. The method of claim 1, wherein directing the gas cluster ion beam toward a degraded region of a surface of the semiconductor structure comprises irradiating the surface with the gas cluster ion beam at a dosage in a range extending from approximately $1 \times 10^{13}$ ions/$cm^2$ to approximately $5 \times 10^{15}$ ions/$cm^2$.

9. The method of claim 1, wherein directing the gas cluster ion beam toward a degraded region of a surface of the semiconductor structure comprises forming an oxide material having a thickness in a range extending from approximately thirty angstroms (30 Å) to approximately one-hundred-forty angstroms (140 Å).

10. The method of claim 1, wherein directing the gas cluster ion beam toward a degraded region of a surface of the semiconductor structure comprises forming an oxide material having a roughness of less than approximately six angstroms (6 Å).

11. The method of claim 1, wherein directing the gas cluster ion beam toward a degraded region of a surface of the semiconductor structure comprises exposing the surface to the gas cluster ion beam at a temperature less than or equal to approximately 250° C.

12. The method of claim 1, wherein directing the gas cluster ion beam toward a degraded region of a surface of the semiconductor structure comprises accelerating the oxidizing matter at an energy in a range extending from approximately one kiloelectron volt (1 keV) to approximately sixty kiloelectron volts (60 keV).

13. The method of claim 1, wherein directing the gas cluster ion beam toward a degraded region of a surface of the semiconductor structure comprises orienting the gas cluster ion beam in a direction parallel to an exposed region of a conductive line within a gate stack on the surface.

14. A method of fabricating a semiconductor device, comprising: exposing a damaged region of a substrate of the semiconductor device adjacent a gate stack to a gas cluster ion beam comprising oxidizing matter to oxidize a surface of the substrate and repair the damaged region.

15. The method of claim 14, wherein exposing a damaged region of a substrate of the semiconductor device comprises exposing the damaged region to a gas cluster ion beam generated from a source gas selected from the group comprising oxygen, nitric oxide, carbon monoxide, carbon dioxide, water, hydrogen peroxide, nitrogen, argon, helium, krypton, neon, and combinations thereof.

16. The method of claim 14, wherein the gate stack comprises exposed sidewalls oriented substantially perpendicular to laterally adjacent surfaces of the substrate, and exposing a damaged region of a substrate of the semiconductor device comprises exposing the laterally adjacent surfaces of the substrate.

17. The method of claim 15, wherein exposing a damaged region of a substrate of the semiconductor device comprises orienting the gas cluster ion beam in a direction substantially parallel to the exposed sidewalls.

18. The method of claim 14, wherein exposing a damaged region of a substrate of the semiconductor device comprises accelerating the oxidizing matter at an energy in a range extending from approximately one kiloelectron volt (1 keV) to approximately sixty kiloelectron volt (60 keV), each gas cluster comprising a number of molecules in a range extending from approximately one hundred (100) molecules to approximately five thousand (5,000) molecules.

19. The method of claim 14, wherein exposing a damaged region of a substrate of the semiconductor device comprises oxidizing a surface of the substrate and an edge of a polysilicon material abutting the surface and underlying a conductive material.

20. The method of claim 14, wherein exposing a damaged region of a substrate of the semiconductor device comprises forming an oxide material having a thickness in a range extending from approximately thirty angstroms (30 Å) to approximately one-hundred-forty angstroms (140 Å).

21. The method of claim 14, wherein exposing a damaged region of a substrate of the semiconductor device comprises forming an oxide material having an average roughness ($R_a$) of less than approximately six angstroms (6 Å).

22. The method of claim 14, wherein exposing a damaged region of a substrate of the semiconductor device comprises orienting the gas cluster ion beam in a direction perpendicular to a surface of the overlying region of the substrate.

23. The method of claim 14, wherein exposing a damaged region of a substrate of the semiconductor device comprises exposing a surface of the substrate overlying the region at a temperature of less than approximately 250° C.

24. A method for selectively oxidizing a semiconductor structure, comprising:
targeting at least one region on a semiconductor structure, the at least one region comprising a degraded oxide material;
exposing a surface of the at least one region with a gas cluster ion beam comprising an oxidizing matter; and
oxidizing the degraded oxide material.

25. A method for selectively oxidizing a semiconductor structure, comprising:
generating a gas cluster ion beam comprising an oxidizing matter; and
directing the gas cluster ion beam toward a degraded region of a surface of the semiconductor structure in a direction parallel to an exposed region of a conductive line within a gate stack on the surface.

26. A method of fabricating a semiconductor device, comprising exposing a region of a substrate of the semiconductor device adjacent a gate stack to a gas cluster ion beam comprising oxidizing matter to oxidize a surface of the substrate and an edge of a polysilicon material abutting the surface and underlying a conductive material.

27. A method for selectively oxidizing a semiconductor structure, comprising:
generating a gas cluster ion beam comprising an oxidizing matter; and
directing the gas cluster ion beam toward at least one degraded region of a surface of the semiconductor structure adjacent at least one conductive element formed on the surface of the semiconductor structure, the at least one degraded region of the surface comprising at least one LDD extension region of a transistor.

28. A method for selectively oxidizing a semiconductor structure, comprising:
generating a gas cluster ion beam comprising an oxidizing matter; and
directing the gas cluster ion beam toward a degraded region of a surface of the semiconductor structure adjacent at least one conductive element comprising a conductive line within a gate stack formed on the surface of the semiconductor structure by orienting the gas cluster ion beam in a direction parallel to an exposed region of the conductive line.

* * * * *